United States Patent

[11] 3,588,735

[72] Inventors Kern K. N. Chang
Princeton;
Hans John Prager, Belle Mead; Sherman
Weisbrod, Trenton, N.J.

[21] Appl. No. 830,652
[22] Filed June 5, 1969
[45] Patented June 28, 1971
[73] Assignee RCA Corporation

[54] UHF OR L BAND NONFREE-RUNNING AVALANCHE DIODE POWER AMPLIFYING FREQUENCY SYNCHRONIZED OSCILLATOR
6 Claims, 2 Drawing Figs.

[52] U.S. Cl. 331/47, 330/5, 330/34, 331/101, 331/107
[51] Int. Cl. H03b 7/14, H03f 3/10
[50] Field of Search 331/96, 101, 107, 107 (G), 47; 330/5, 34

[56] References Cited
UNITED STATES PATENTS

| | | | |
|---|---|---|---|
| 3,466,563 | 9/1969 | Thim | 330/5X |
| 3,477,029 | 11/1969 | Copeland | 330/5 |
| 3,490,051 | 1/1970 | Hakkie et al. | 330/5 |
| 3,509,478 | 4/1970 | Thim | 331/101X |

*Primary Examiner*—Roy Lake
*Assistant Examiner*—Siegfried H. Grimm
*Attorney*—Edward J. Norton

ABSTRACT: An avalanche diode in cooperative relationship with a UHF or L band wave tuning structure amplifies low power oscillations at a frequency in the UHF or L band applied to the wave tuning structure, if the avalanche diode is biased with a bias level slightly below the threshold value at which free running oscillations take place.

Figure 1:
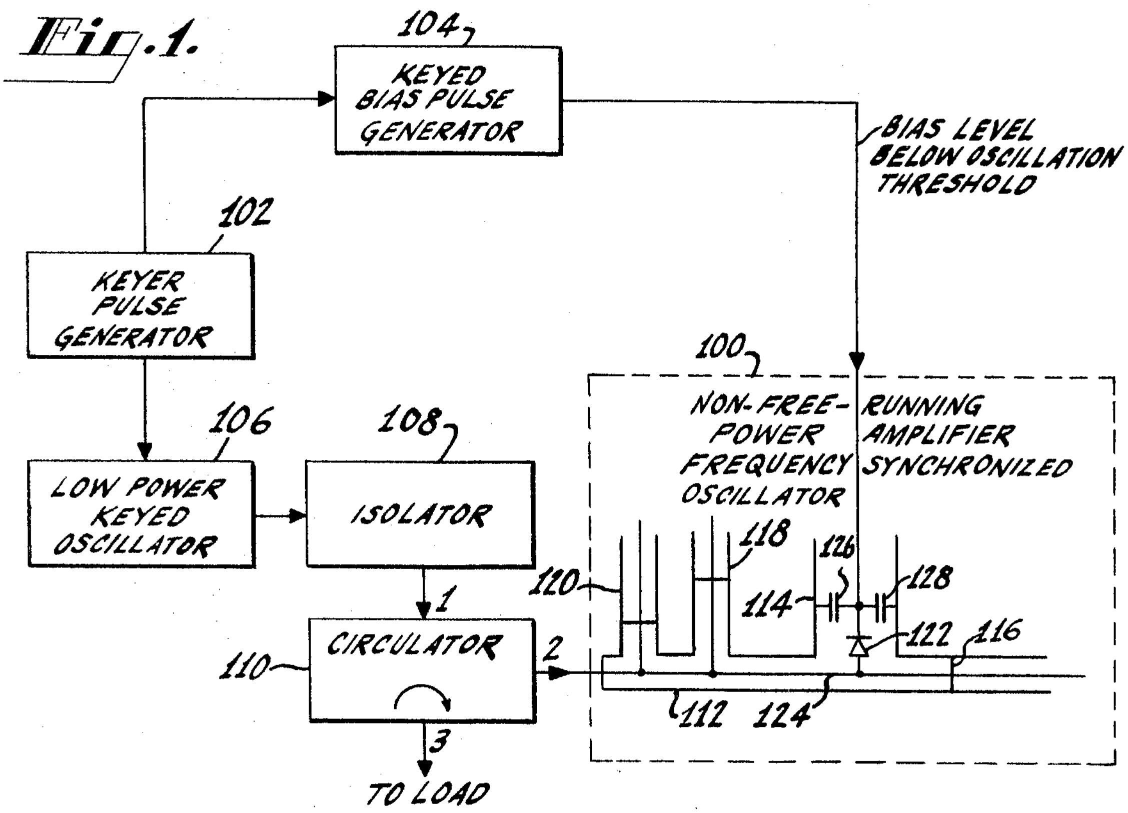

Inventors:
HANS J. PRAGER,
KERN K.N. CHANG &
SHERMAN WEISBROD

BY George J. Seligsohn
ATTORNEY

UHF OR L BAND NONFREE-RUNNING AVALANCHE DIODE POWER AMPLIFYING FREQUENCY SYNCHRONIZED OSCILLATOR

The invention herein described was made in the course of or under a contract or subcontract thereunder with the Department of the Air Force.

This invention relates to UHF and L band power amplifying circuits and, more particularly, to such circuits employing an avalanche diode.

We reported in an article entitled "High-Power, High-Efficiency Silicon Avalanche Diodes at Ultra High Frequencies," appearing on page 586 of the Proceedings of the IEEE, Apr. 1967, that an appropriately doped and dimensioned silicon avalanche diode, when placed in cooperative relationship with a wave tuning structure tuned to a frequency in the UHF or L band, would generate oscillations at the frequency of the wave tuning structure with high efficiency (up to 25 percent) and high power output (up to 435 watts), if a bias pulse level at least equal to a predetermined threshold value is applied thereto. Since avalanche diodes have transit time frequencies significantly higher than the UHF or L band range (usually in the X band range), the mode of operation of an avalanche diode which produces high power with high efficiency at frequencies in the UHF and L band range was not, and is still not, very well understood. For this reason, the operation of an avalanche diode at a frequency in the UHF or L-band is referred to as the anomalous mode.

Different and somewhat contradictory theories have been advanced to explain this high efficiency, high power anomalous mode. For instance, two such theories are discussed in the article "Why High Efficiency at Avalanche Sub-Harmonics?", appearing on page 14 of the Apr. 1969 issue of Microwaves, published by Hayden Microwaves Corporation. Thus, the anomalous mode of operation of an avalanche diode, although desirable, remains at this time essentially empirical.

In accordance with the present invention, it has now been found that an avalanche diode may be operated in its anomalous mode to produce a high power output at high efficiency at a frequency in the UHF or L band in a driven, nonfree-running, power-amplifying, frequency-synchronized oscillator, rather than as heretofore in a free-running oscillator. This is accomplished by applying a bias level and circuit loading conditions to the avalanche diode below the threshold values required to generate free-running oscillations. In order to operate the nonfree-running oscillator of the present invention, low power oscillations are applied through coupling means to the wave tuning structure of the oscillator. The frequency of the low power oscillations may differ from the frequency to which the wave tuning structure is tuned by no more than a given amount. In response thereto, high power oscillations in frequency synchronism with the applied low power oscillations are generated. In accordance with a preferred embodiment of the invention, the coupling means includes directional coupling means, such as a circulator, for both forwarding the low power oscillations from a low power oscillator to the wave tuning structure and for forwarding the generated high power oscillations from the wave tuning structure to an external load.

It is therefore an object of the present invention to provide a nonfree-running, power-amplifying, frequency-synchronized oscillator for a frequency in the UHF or L band employing an avalanche diode.

Figure 2:
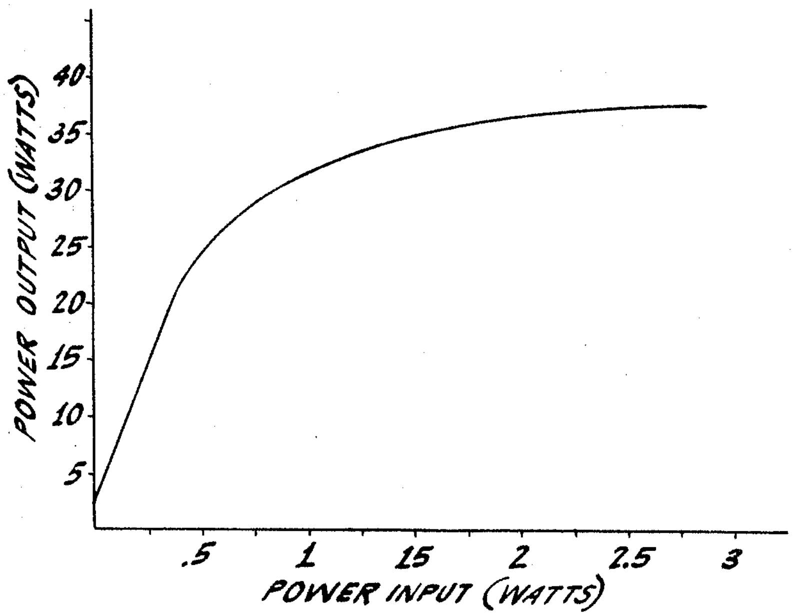

This and other objects, features and advantages of the present invention will become more apparent from the following detailed description taken together with the accompanying drawing, in which:

FIG. 1 is a block diagram of a preferred embodiment of the present invention; and FIG. 2 is a plot of power output vs. power input exemplifying the operation of a nonfree-running oscillator employing the present invention.

Referring to FIG. 1, there is shown nonfree-running, power-amplifying frequency-synchronized oscillator 100; keyer pulse generator 102; keyed bias pulse generator 104; low power keyed oscillator 106; isolator 108; and circulator 110.

Oscillator 100 comprises coaxial wave tuning structure 112 which is equipped with cavity portion 114, sliding short tuner 116, first stub tuner 118 and second stub tuner 120. In cavity portion 114 is located avalanche diode 122 having its anode coupled to center conductor 124 of coaxial structure 112 and its cathode coupled to the output of keyed bias pulse generator 104. Capacitances 126 and 128 bypass RF signals within cavity 114 and prevent them from reaching keyed bias pulse generator 104.

The avalanche diode employed in oscillator 100 is of the same type described in our above-mentioned article appearing on page 586 of the Apr. 1967 issue of Proceedings of the IEEE. In particular, the diode is a silicon avalanche diode with a $PNN^+$ mesa structure, in which a thin substrate to $N^+$ was prepared with an N-type epitaxial layer of 4 to 6 ohm centimeter resistivity at a thickness of 8 to 20 microns. Through boron deposition and diffusion a P-type region with an abrupt junction was formed. The wafer was then processed by proper masking and etching techniques until a mesa structure with a 26-mil diameter was produced. The successful completion of the final etching step was reached when the monitoring of the reverse breakdown voltage indicated a sharp break in the current voltage characteristic between 160 and 185 volts. Recognizing the importance of adequate thermal conduction for such high voltage and high dissipation devices, a heavy copper pedestal and pin were incorporated in the coaxial encapsulating package. The complete diode assembly exhibited a capacitance of about 10 picofarads at −6 volts bias, and a corresponding cutoff frequency of approximately 20 gigaHertz.

Keyer pulse generator 102 generates keyer pulses at a relatively low duty cycle of 1 percent or less. In response to each of these keyer pulses an input signal is applied, as shown, to keyed bias pulse generator 104, which, in response thereto, generates a bias pulse which is utilized to reverse bias avalanche diode 122. The level of the bias pulse from generator 104 is just below the oscillation threshold bias level at which the combination of avalanche diode 122 and wave tuning structure 112 will operate as a free-running oscillator. (The oscillation threshold bias level is about 150 volts and the level of the bias pulse from generator 104 is usually about 2 volts more or less below this oscillation threshold value.)

Coaxial wave tuning structure 112 is tuned by means of sliding short tuner 116 and stub tuners 118 and 120 to support a first given frequency in the UHF or L band, as the case may be. However, since the applied bias level is below the oscillation threshold, no oscillations at this first given frequency are inherently produced by the cooperative combination of avalanche diode 122 and wave tuning structure 112. Thus, oscillator 100 is nonfree-running.

Low power keyed oscillator 106, which is keyed on by a signal applied thereto from keyer pulse generator 102 in response to each keyer pulse, generates low power oscillations at a second given frequency in the UHF or L band, as the case may be, for the duration of each keyer pulse. The second given frequency may or may not be equal to the first given frequency, but in no case do these two given frequencies differ from each other by more than a predetermined amount discussed in more detail below.

The output of oscillator 106 is forwarded through isolator 108 and ports 1—2 of circulator 110 to the left side of wave tuning structure 112, as shown, to thereby inject low power oscillations at the second given frequency into the wave tuning structure 112 at the same time that the bias level pulse is being applied to avalanche diode 122. In response thereto, oscillator 100 produces output oscillations at the second given frequency with an amplified power which is a function both of the input power of the applied low power oscillations and the difference between the first and second given frequencies (the frequency to which wave tuning structure 112 is tuned and the frequency of the applied low power oscillations). The high power oscillations generated in oscillator 100 are extracted from the left side of wave tuning structure 112 and forwarded through ports 2—3 of circulator 110 to an output load, not shown. Thus, oscillator 100 is operated as a reflective power amplifier.

FIG. 2 illustrates the plot of the power output of oscillator 100 with respect to the power input thereto for one exemplary typical case. As shown, at relatively low power inputs, the power amplification is linear. At relatively high power inputs, the power amplification tends to saturate at a power output level which is substantially the same as the power output level which would be obtained if the bias level were at least equal to oscillation threshold and the oscillator operated in its free running mode.

The given amount by which the first given frequency, at which wave tuning structure 112 is tuned, and the second given frequency of the low power input oscillations may differ is determined by the "pulling" capability of the oscillator, which causes the output oscillations to be frequency synchronized with the second given frequency of the input oscillations, rather than the first given frequency of the wave tuning structure. One of the important features of the present invention is that this "pulling" capability is strong, being in the order of ±5 percent of the frequency of the input oscillations. Thus, if the frequency of the input oscillations is 400 MHz., the wave tuning structure may be tuned anywhere between 380 MHz. and 420 MHz. and still the output oscillations will occur at 400 MHz., in synchronism with the frequency of the input oscillations. However, the price that must be paid for this is that the power amplification obtainable becomes lower as the difference between the first and second given frequencies becomes larger.

We claim:

1. In combination with an oscillator comprising an avalanche diode dimensioned and doped to have a characteristic transit time mode at a frequency significantly higher than the L-band and a wave tuning structure for supporting oscillations at a first given frequency within the UHF or L band to which structure said diode is cooperatively coupled, said oscillator being free running to generate oscillations at said oscillator being free running to generate oscillations at said first given frequency only in response to a bias level at least equal to a threshold value being applied to said diode; the improvement therewith of bias means for applying a bias level of less than said threshold value to said avalanche diode, whereby said oscillator is nonfree-running, and means for applying to said structure relatively low power input oscillations of a second given frequency in said UHF or L band which differs from said first given frequency by no more than a given amount, whereby said oscillator generates relatively high power oscillations at said second given frequency.

2. The combination defined in claim 1, wherein said means for applying to said structure low power oscillations includes a low power oscillator and coupling means for applying oscillations from said low power oscillator to said structure.

3. The combination defined in claim 2, wherein said coupling means include directional coupling means having at least three terminals with a first of said terminals coupled to said low power oscillator, a second of said terminals coupled to said structure and a third of said terminals coupled to a load, whereby said directional coupler is effective in forwarding said low power oscillations from said low power oscillator to said structure and in forwarding said generated high power oscillations from said structure to said load.

4. The combination defined in claim 3, wherein said directional coupling means is a circulator.

5. The combination defined in claim 1, wherein said bias means is a pulse generator for intermittently generating pulses having said bias level of less than said threshold value with no more than a given duty cycle, to thereby permit operation of said oscillator at a relatively low average power with respect to the generated high power oscillations.

6. The combination defined in claim 5, wherein said pulse generator comprises a keyed bias pulse generator and a keyer pulse generator coupled to said keyed bias pulse generator for controlling said keyed bias pulse generator, and wherein said means for applying said low power oscillations includes a keyed low power oscillator coupled to said keyer pulse generator for operating said low power oscillator substantially simultaneously with the application of said bias level to said diode.